US010384931B2

(12) United States Patent
Takizawa

(10) Patent No.: US 10,384,931 B2
(45) Date of Patent: Aug. 20, 2019

(54) ELECTRONIC DEVICE HAVING A BONDING WIRE CONNECTED TO A TERMINAL AT AN ALLOYED PORTION

(71) Applicant: Seiko Epson Corporation, Tokyo (JP)

(72) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/277,227

(22) Filed: Sep. 27, 2016

(65) Prior Publication Data
US 2017/0121171 A1  May 4, 2017

(30) Foreign Application Priority Data
Nov. 4, 2015  (JP) .................. 2015-216933

(51) Int. Cl.
B81B 7/00 (2006.01)
G01C 19/5769 (2012.01)

(52) U.S. Cl.
CPC .......... B81B 7/007 (2013.01); G01C 19/5769 (2013.01); B81B 2207/097 (2013.01); H01L 2224/48091 (2013.01); H01L 2224/48227 (2013.01); H01L 2924/181 (2013.01)

(58) Field of Classification Search
CPC . B81B 7/007; B81B 2207/097; B81C 1/0023; G01C 19/5712; G01C 19/5769; H01L 24/02–09
See application file for complete search history.

(56) References Cited

U.S. PATENT DOCUMENTS

| 4,622,576 | A | * | 11/1986 | Buynoski | .......... H01L 23/53271 257/629 |
| 5,431,052 | A | | 7/1995 | Bischof et al. | |
| 5,661,081 | A | * | 8/1997 | Hsue | .................. H01L 24/03 257/E21.519 |
| 6,097,821 | A | | 8/2000 | Yokoyama et al. | |
| 6,559,487 | B1 | | 5/2003 | Kang et al. | |
| 9,038,463 | B2 | | 5/2015 | Takizawa | |
| 9,068,835 | B2 | | 6/2015 | Yoda et al. | |
| 2005/0224984 | A1 | * | 10/2005 | Hortaleza | .............. H01L 24/03 257/762 |
| 2008/0042260 | A1 | | 2/2008 | Jeong et al. | |
| 2012/0267150 | A1 | * | 10/2012 | Yoda | .................. G01C 19/5783 174/257 |

(Continued)

FOREIGN PATENT DOCUMENTS

| JP | 05-264579 A | 10/1993 |
| JP | 10-160611 A | 6/1998 |

(Continued)

Primary Examiner — Matthew C Landau
Assistant Examiner — Mark Hatzilambrou
(74) Attorney, Agent, or Firm — Harness, Dickey & Pierce, P.L.C.

(57) ABSTRACT

An electronic device includes a substrate, a functional element that is arranged on the substrate, a terminal that is arranged on the substrate and that is electrically connected to the functional element, and a bonding wire that is connected to the terminal. The terminal has an alloy portion that is alloyed to the bonding wire at a connection portion between the terminal and the bonding wire, and the thickness of the terminal is larger than the thickness of the alloy portion. Moreover, the terminal is formed of the same material (silicon) as the functional element.

19 Claims, 10 Drawing Sheets

(56) References Cited

U.S. PATENT DOCUMENTS

2013/0074596 A1* 3/2013 Takizawa .............. B81B 7/0041
                                                    73/504.12
2013/0256814 A1* 10/2013 Tanaka ................. B81B 3/0021
                                                    257/415
2014/0367806 A1* 12/2014 Tanaka ................. B81B 3/0097
                                                    257/415

FOREIGN PATENT DOCUMENTS

| | | |
|---|---|---|
| JP | 2000-082824 A | 3/2000 |
| JP | 2001-189467 A | 7/2001 |
| JP | 2008-046078 A | 2/2008 |
| JP | 2012-225803 A | 11/2012 |
| JP | 2013-015477 A | 1/2013 |
| JP | 2013-102036 A | 5/2013 |
| JP | 2014-021065 A | 2/2014 |

* cited by examiner

ELECTRONIC DEVICE HAVING A BONDING WIRE CONNECTED TO A TERMINAL AT AN ALLOYED PORTION

BACKGROUND

1. Technical Field

The present invention relates to an electronic device, a method of manufacturing the electronic device, an electronic apparatus, and a mobile body.

2. Related Art

To date, the structure described in JP-T-2000-82824 is known as an acceleration sensor. The acceleration sensor described in JP-T-2000-82824 has a base portion, movable electrodes that can be displaced with respect to the base portion, and fixed electrodes that are fixed to the base portion and that form an electrostatic capacitance between the fixed electrodes and the movable electrodes, and the acceleration sensor can detect application of an acceleration on the basis of the electrostatic capacitance that changes with the displacement of the movable electrodes. Moreover, the movable electrodes and the fixed electrodes are each electrically connected to terminals via wires, and the terminals are electrically connected to an external device such as an IC via bonding wires (linear wires) or the like.

However, in the acceleration sensor of JP-T-2000-82824, it is presumed that the thickness of the terminals is relatively small because the terminals are formed of aluminum. Consequently, if the terminals are thin, there is a risk in that it is easy for the connection strength between the terminals and the bonding wires to become weak and the bonding wires end up coming off the terminals.

SUMMARY

An advantage of some aspects of the invention is that an electronic device having excellent connection strength between a terminal and a linear wire, a method of manufacturing the electronic device, an electronic apparatus, and a mobile body are provided.

An electronic device of the invention includes a substrate, a functional element that is arranged on the substrate, a terminal that is arranged on the substrate and that is electrically connected to the functional element, and a linear wire that is connected to the terminal. The terminal is alloyed to the linear wire at a connection portion of the linear wire, and a thickness of the terminal is larger than a thickness of the alloyed portion.

Consequently, an electronic device with excellent connection strength between a terminal and a linear wire is provided.

In the electronic device of the invention it is preferable that the terminal be formed of the same constituent material as the functional element.

As a result, it is possible to form the functional element and the terminal by performing patterning by, for example, etching a board. Therefore, the method of manufacturing the electronic device becomes easy.

In the electronic device of the invention it is preferable that the functional element and the terminal contain silicon.

Consequently, for example, it is possible to form the functional element and the terminal by performing patterning by etching a silicon substrate. Therefore, the method of manufacturing the electronic device becomes easy. Specifically, it is possible to perform highly precise patterning of a silicon substrate by etching.

In the electronic device of the invention, it is preferable that one of the main surfaces of the substrate have a functional element arrangement surface on which the functional element is arranged and a terminal arrangement surface on which the terminal is arranged.

Consequently, by joining one of the main surfaces of the substrate to a board and by performing patterning by, for example, etching the board, a functional element and a terminal can easily be formed.

In the electronic device of the invention, it is preferable that the substrate have a groove formed in the one of the main surfaces and a wire be arranged in the groove, the wire being electrically connected to the functional element through a first connecting member and being electrically connected to the terminal through a second connecting member.

Consequently, it is possible to electrically connect the functional element and the terminal to each other with a relatively simple structure.

In the electronic device of the invention, it is preferable that a metal film be arranged on a surface of the terminal.

Consequently, it is possible to decrease oxidation of the terminal.

In the electronic device of the invention, it is preferable that the electronic device include a lid that is joined to the substrate so as to house the functional element between the lid and the substrate, and the terminal be located on an outer side of the lid.

Consequently, it is possible to protect the functional element as well as easily connect the terminal and a linear wire to each other.

In the electronic device of the invention it is preferable that the substrate and the lid be joined to each other through a glass material.

Consequently, it is possible to hermetically join the substrate and the lid. Moreover, it is possible to suppress the occurrence of outgassing from a space that houses the functional element.

A method of manufacturing an electronic device includes a process of joining a first substrate and a second substrate, and a process of forming a functional element and a terminal from the second substrate by patterning the second substrate.

Consequently, it is possible to easily form a terminal with a large thickness.

An electronic apparatus of the invention includes the electronic device of the invention.

Consequently, an electronic apparatus with high reliability is provided.

A mobile body of the invention includes the electronic device of the invention.

Consequently, a mobile body with high reliability is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic device, a method of manufacturing the electronic device, an electronic apparatus, and a mobile body of the invention will be described in detail based on embodiments shown in accompanying drawings.

First Embodiment

Figure 1:
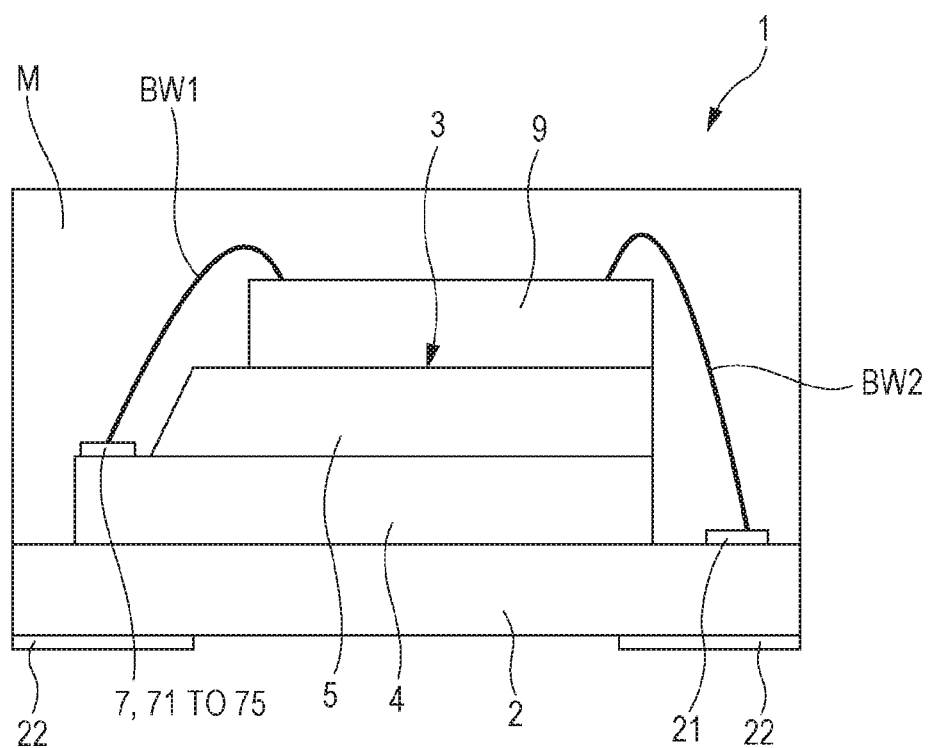
FIG. 1 is a side view of an electronic device according to a first embodiment of the invention.
Figure 1:
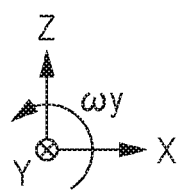
Figure 2:
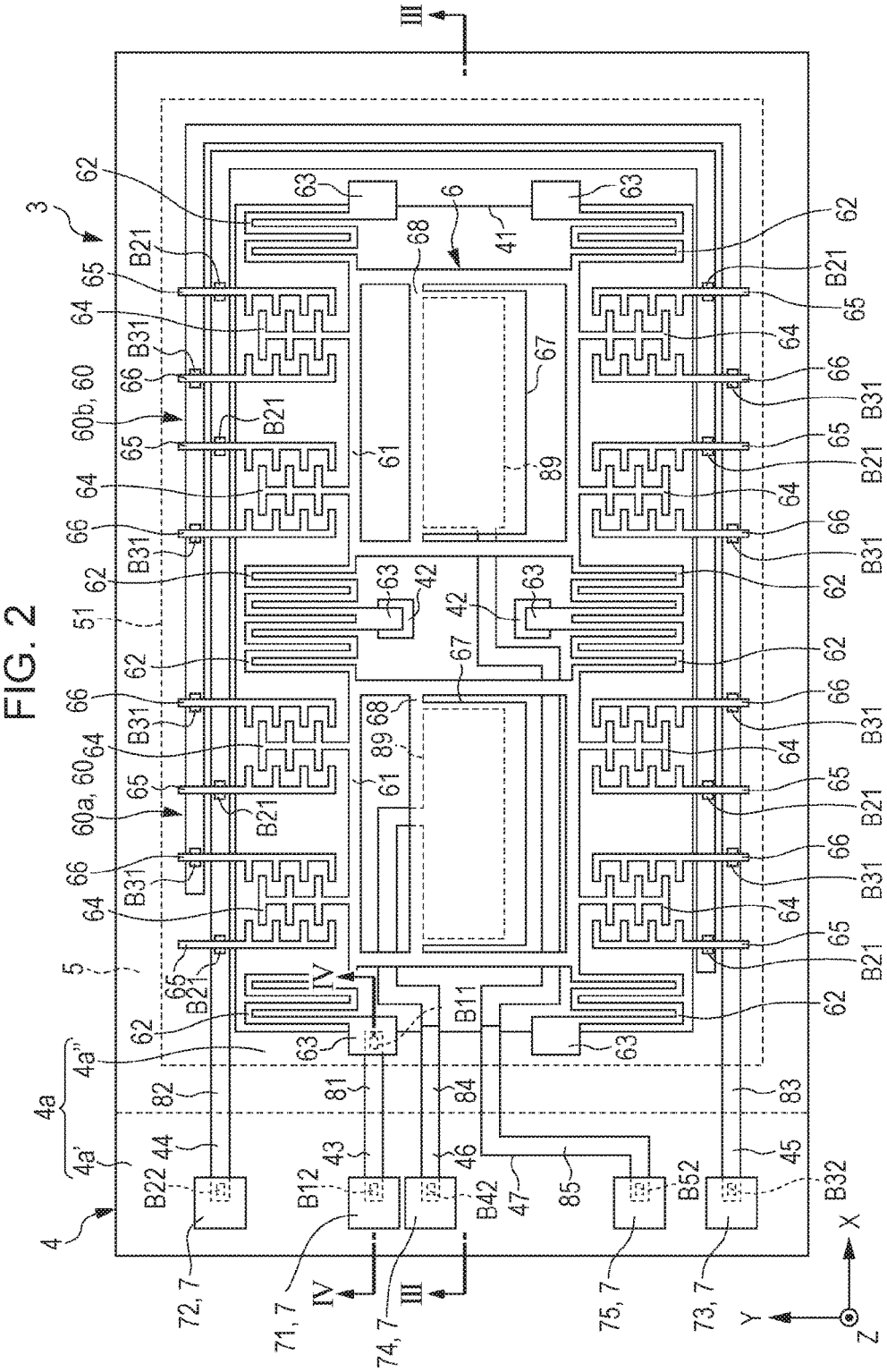
FIG. 2 is a plan view of a gyrosensor element that has the electronic device illustrated in FIG. 1.
Figure 3:
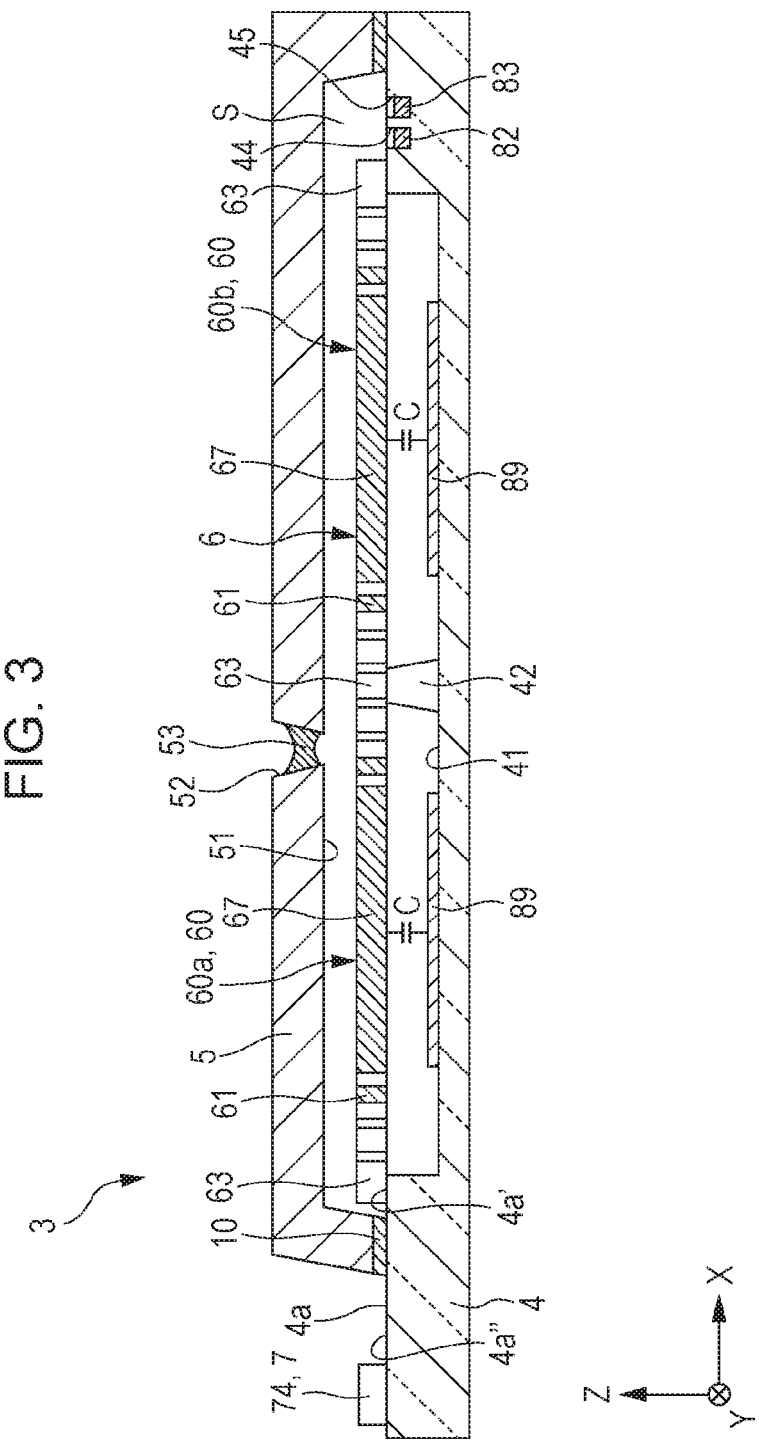
FIG. 3 is a cross-sectional view taken along the line III-III in FIG. 2.
Figure 4:
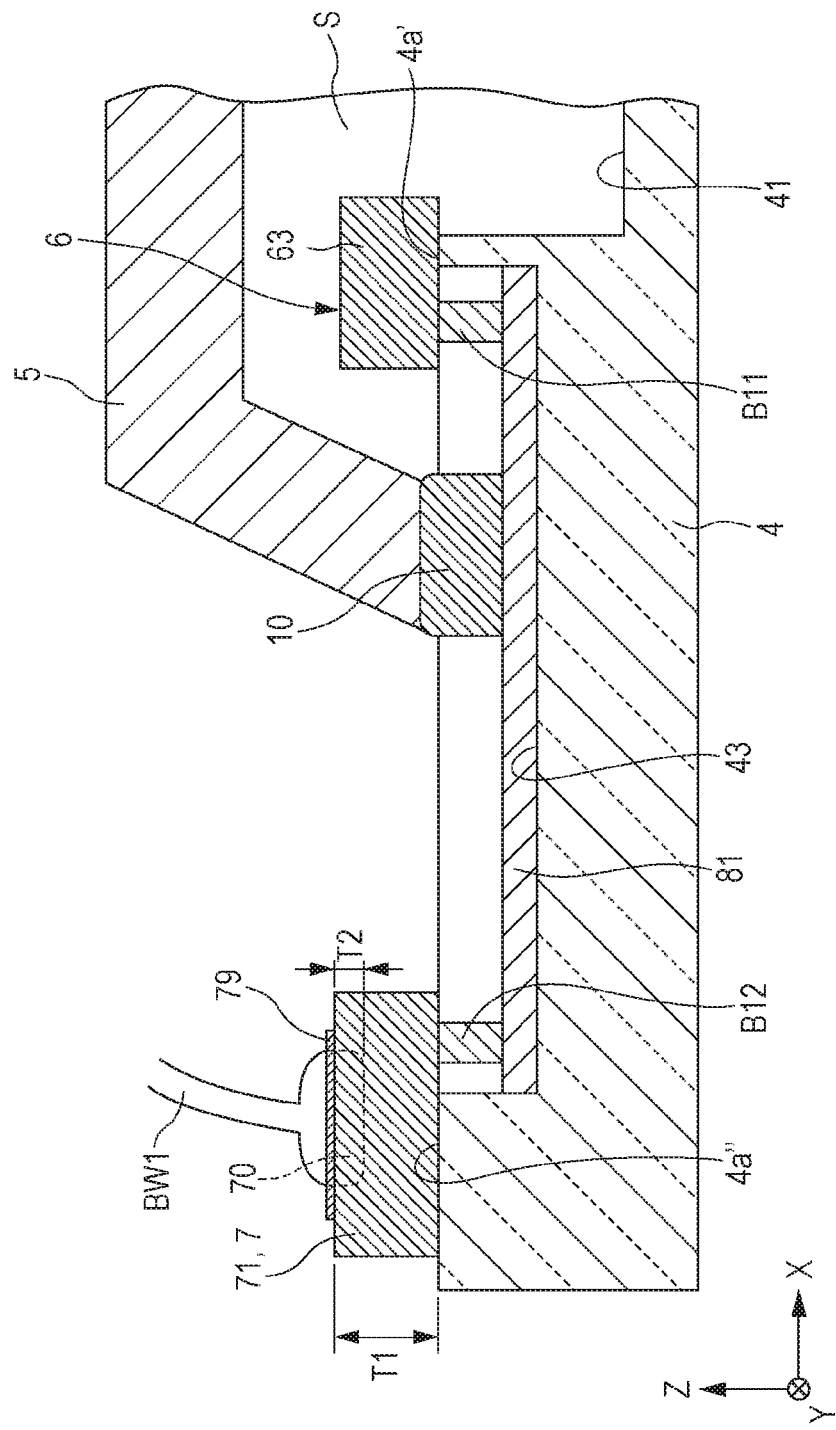
FIG. 4 is a cross-sectional view taken along line IV-IV in FIG. 2.

FIG. 1 is a side view of an electronic device according to a first embodiment of the invention. FIG. 2 is a plan view of a gyrosensor element that is included in the electronic device illustrated in FIG. 1. FIG. 3 is a cross-sectional view taken along the line III-III in FIG. 2. FIG. 4 is a cross-sectional view taken along line IV-IV in FIG. 2. FIGS. 5 to 13 are cross-sectional views for explaining a method of manufacturing the electronic device illustrated in FIG. 1. Further, in the descriptions below, three axes that are perpendicular to one another will be denoted as the X axis, Y axis and Z axis. Moreover, the direction along the X axis will be called the "X-axis direction", the direction along the Y axis will be called the "Y-axis direction", and the direction along the Z axis will be called the "Z-axis direction".

Electronic Device

An electronic device 1 illustrated in FIG. 1 is a gyrosensor that can detect an angular velocity ωy about the Y axis. The electronic device 1 includes a substrate 2, a gyrosensor element 3 that is fixed on an upper surface of the substrate 2, an IC 9 (electronic component) that is fixed on an upper surface of the gyrosensor element 3, bonding wires BW1 that electrically connect the gyrosensor element 3 and the IC 9 to each other, bonding wires BW2 that electrically connect the substrate 2 and the IC 9 to each other, and a mold material M which the gyrosensor element 3 and the IC 9 are molded in. Hereinafter, each of these components will be described in order.

Substrate

The substrate 2 supports the gyrosensor element 3. Moreover, a plurality of terminals 21 are arranged on the upper surface of the substrate 2, and a plurality of mounting terminals 22 that are connected to the terminals 21 via internal wires or the like (not illustrated) are arranged on a lower surface of the substrate 2. There is no particular limitation regarding the substrate 2; for example, a silicon substrate, a ceramic substrate, a resin substrate, a glass substrate, a glass epoxy substrate, or the like may be used.

Gyrosensor Element

The gyrosensor element 3 as illustrated in FIG. 2 and FIG. 3, includes a substrate 4, a lid 5, a functional element 6, and terminals 7.

The substrate 4 includes a recessed portion 41 formed on an upper surface 4a (one of the main surfaces) of the substrate 4 and a post 42 provided in the recessed portion 41, and the functional element 6 is supported by the upper surface 4a and the post 42. Moreover, the substrate 4 includes groove portions 43, 44, 45, 46, and 47 formed in the upper surface 4a so as to have a shallower depth than the recessed portion 41, and at least one of the groove portions 43 to 47 is located on the outside of the lid 5. Wires 81, 82, 83, 84, and 85 are led around the inside of the groove portions 43, 44, 45, 46, and 47.

The substrate 4 having such a structure may, for example, be formed of a glass material. However, there is no particular limitation regarding the constituent material of the substrate 4; for example, the substrate 4 may be formed of silicon. Moreover, there is no particular limitation regarding the constituent material of the wires to 85 as long as the material has electrical conductivity; for example, aluminum, gold, platinum, indium tin oxide (ITO) or the like can be used.

The lid 5 includes a recessed portion 51 that is formed in a lower surface of the lid 5. Moreover, the substrate 4 and the lid 5 are joined to each other so as to form an internal space S by the recessed portion 41 and the recessed portion 51, and the functional element 6 is housed in the internal space S. The internal space S is hermetically sealed, and is in a low-pressure state (preferably, less than 10 Pa). As a result, the viscous resistance decreases and it is possible to effectively vibrate the functional element 6. Moreover, the lid 5, as illustrated in FIG. 3, includes a sealing hole 52 for creating a low-pressure state in the internal space S, and the sealing hole 52 is sealed with a sealant 53. There is no particular limitation regarding the sealant 53; for example, a Au—Ge alloy may be used.

The lid 5 having such a structure is, for example, formed of silicon. However, there is no particular limitation regarding the constituent material of the lid 5; for example, the lid 5 may be formed of a glass material.

The substrate 4 and the lid 5 described above are joined to each other through a joining member 10. Because it is possible to easily join the substrate 4 and the lid 5 to each other by using the joining member 10, and it is possible to seal off the groove portions 43 to 47 by using the joining member 10, it is possible to easily hermetically seal the internal space S. There is no particular limitation regarding the joining member 10; for example, a glass material such as glass frit may be used. Even if irregularities of the groove portions 43 to 47 are formed in the substrate 4, by using a glass material having a particularly low melting point as the joining member 10 it is possible to perform joining and sealing by pouring the glass material at a low temperature. Consequently, it is possible to protect against a decrease in the degree of vacuum of the internal space S, contaminants and the like.

The joining member 10 is not limited to a glass material; for example, any of the metal materials of solder, gold solder, silver solder or the like may be used. Even if such a material is used, it is possible to easily hermetically join the substrate 4 and the lid 5. However, in the case where a metal material is used as the joining member 10, for example, an insulation process for forming an insulating film on the wires 81 to 85 is necessary so that the wires 81 to 85 do not short circuit via the joining member 10. Moreover, the substrate 4 and the lid 5 may, for example, be joined by eutectic bonding of a metallized layer arranged on the upper surface of the substrate 4 and a metallized layer arranged on the lower surface of the lid 5.

Moreover, as described above, because the substrate 4 is formed of glass and the lid 5 is formed of silicon, the substrate 4 and the lid 5 may be joined by anodic joining without using the joining member 10. In this case, because it is not possible to seal off the groove portions 43 to 47, for example, the internal space S may be hermetically sealed by sealing off the groove portions 43 to 47 with a $SiO_2$ film formed by a tetraethoxysilane (TEOS) CVD process or the like.

The functional element 6, as described above, is arranged in the internal space S and is joined to the upper surface 4a of the substrate 4 and the post 42. The functional element 6 includes two structure bodies 60 (structure body 60a and structure body 60b) side by side in the X-axis direction.

The structure bodies 60 include vibration portions 61, drive spring portions 62, fixed portions 63, movable drive electrodes 64, fixed drive electrodes 65 and 66, detection flap plates 67, and beam portions 68. The structure bodies 60 are integrally formed by patterning an electrically conductive silicon substrate doped with impurities such as phosphorous, boron or the like by etching (for example, dry etching). Specifically, by using silicon, it is possible to increase etching processing accuracy.

The vibration portions 61 are rectangular frame bodies and are connected to one of the end portions of the drive spring portions 62 at each of the four corners of the vibration portions 61. The other one of the end portions of each of the drive spring portions 62 is connected to a corresponding one of the fixed portions 63 and the fixed portions 63 are joined to the upper surface 4a of the substrate 4 or the post 42. Consequently, the vibration portions 61 and the drive spring portions 62 are supported in a floating state above the substrate 4. Therefore, by making the drive spring portions 62 elastically deform in the X-axis direction, it is possible to vibrate the vibration portions 61 in the X-axis direction with respect to the substrate 4. Further, there is no particular limitation regarding the method of joining the fixed portions 63 and the substrate 4; for example, anodic joining may be used.

Moreover, at least one of the fixed portions 63 is electrically connected to the wire 81 inside the groove portion 43 through the electrically conductive bump B11 (the first connecting member). Consequently, it is possible to easily perform electrical connection of the fixed portions 63 and the wire 81. Further, as the constituent material of the electrically conductive bump B11, for example, a metal material such as gold, silver, platinum, solder, or the like may be used.

The movable drive electrodes 64 are provided to the vibration portions 61. However, the fixed drive electrodes 65 and 66 are joined to the substrate 4 and are provided in such a manner that the movable drive electrodes 64 are respectively interposed therebetween. Moreover, the fixed drive electrodes 65 are electrically connected to the wire inside the groove portion 44 through the electrically conductive bumps B21 (the first connecting members) and the fixed drive electrodes 66 are electrically connected to the wire 83 inside the groove portion 45 through the electrically conductive bumps B31 (the first connecting members). In this way, by using the electrically conductive bumps B21 and B31 it is possible to easily perform electrical connection of the fixed drive electrodes 65 and 66 and the wires 82 and 83. Further, there is no particular limitation regarding the electrically conductive bumps B21 and B31; for example, they may have the same structure as the electrically conductive bump B11.

By applying a drive voltage between the movable drive electrodes 64 and the fixed drive electrodes 65 and 66, an electrostatic force is generated between the movable drive electrodes 64 and the fixed drive electrodes 65 and 66 and consequently it is possible to cause the drive spring portions 62 to elastically deform in the X-axis direction and the vibration portions 61 vibrate in the X-axis direction. In the structure body 60a and the structure body 60b, because the arrangements of the fixed drive electrodes and 66 are reversed, the vibration portion 61 of the structure body 60a and the vibration portion 61 of the structure body 60b vibrate in anti-phase in the X-axis direction so as to approach each other and separate from each other. Consequently, it is possible to cancel the vibration of the structure bodies 60a and 60b and decrease vibration leakage.

Further, in this embodiment, as described above, even though a method (electrostatic drive method) that induces the vibration portions 61 to vibrate by electrostatic force is described, there is no particular limitation regarding the method of inducing the vibration portions 61 to vibrate; a piezoelectric drive method, an electromagnetic drive method that uses the Lorentz force of a magnetic field, or the like may be used.

The detection flap plates 67 are located on the inner side of the vibration portions 61 and are connected at the end portions of the detection flap plates 67 on the +Y axis side to the vibration portions 61 by the beam portions 68. The detection flap plates 67, in the electronic device 1 in which the vibration portions 61 are vibrating in the X-axis direction, as a result of the application of an angular velocity ωy about the Y axis, rotate (tilt) about a rotation axis formed by the beam portions 68 while torsionally deforming the beam portions 68 due to Coriolis force.

In a region (bottom surface of the recessed portion 41) that faces the detection flap plates 67 of the substrate 4, fixed detection electrodes 89 are individually provided and an electrostatic capacitance C is formed between the detection flap plates 67 and the fixed detection electrodes 89. Moreover, the fixed detection electrode 89 on the structure body 60a side is electrically connected to the wire 84 inside the groove portion 46 and the fixed detection electrode 89 on the structure body 60b side is electrically connected to the wire 85 inside the groove portion 47. There is no particular limitation regarding the constituent material of the fixed detection electrodes 89 as long as the material has electrical conductivity; for example, aluminum, gold, platinum, indium tin oxide (ITO) or the like can be used.

Next, the operation of the functional element 6 will be described. Firstly, a drive voltage is applied between the movable electrodes 64 and the fixed drive electrodes 65 and 66, and the vibration portion 61 of the structure body 60a and the vibration portion 61 of the structure body 60b are made to vibrate in the X-axis direction in anti-phase and at a prescribed frequency. In this state, when an angular velocity ωy is applied to the electronic device 1, Coriolis force acts, and the detection flap plate 67 of the structure body 60a and the detection flap plate 67 of the structure body 60b are displaced in anti-phase to each other about the rotation axis. As a result of the detection flap plates 67 being displaced, the gap between the detection flap plates 67 and the fixed detection electrodes 89 changes and the electrostatic capacitance C changes in accordance with this. Consequently, by detecting the amount of change in the electrostatic capacitance C, it is possible to determine the angular velocity ωy.

A plurality of the terminals 7 are arranged on the upper surface 4a of the substrate 4 on the outer side of the lid 5. Consequently, by arranging the terminals 7 on the outer side of the lid 5, it is possible to easily perform electrical connection of the terminals 7 and the IC 9.

Moreover, as illustrated in FIG. 2, the plurality of the terminals 7 include a terminal 71 that is electrically connected to the wire 81 through the electrically conductive bump B12 (second connecting member), a terminal 72 that is electrically connected to the wire 82 through the electrically conductive bump B22 (second connecting member), a terminal 73 that is electrically connected to the wire 83 through the electrically conductive bump B32 (second connecting member), a terminal 74 that is electrically connected to the wire 84 through the electrically conductive bump B42, and a terminal 75 that is electrically connected to the wire 85 through the electrically conductive bump B52. Consequently, by using the electrically conductive bumps B12 and B52 it is possible to easily perform electrical connection of the wires 81 to 85 and the terminals 71 to 75.

The terminals 71 to 75 may be formed of electrically conductive silicon doped with impurities such as phosphorous, boron or the like. That is, the terminals 71 to 75 may be formed of the same constituent material as the functional element 6. Here, as described above, the functional element 6 may be formed by patterning an electrically conductive silicon substrate. By forming the terminals 71 to 75 with the same material as the functional element 6, it is possible to form the functional element 6 together with the terminals 71 to 75 by patterning the silicon substrate. Therefore, it is possible to easily form the terminals 71 to 75 that are relatively thick.

In particular, in this embodiment, the upper surface 4a of the substrate 4 includes a functional element arrangement surface 4a' to which the functional element 6 is fixed and a terminal arrangement surface 4a" on which the terminals 71 to 75 are arranged. That is, the functional element arrangement surface 4a' and the terminal arrangement surface 4a" are located on the same flat surface. Therefore, it is possible to join the above-described silicon substrate to both of the functional element arrangement surface 4a' and the terminal arrangement surface 4a" and it becomes easy to form the functional element 6 together with the terminals 71 to 75.

Each of the terminals 7 (the terminals 71 to 75) is, as illustrated in FIG. 1, electrically connected to the IC 9 through the bonding wires BW1 (linear wires) that are formed of gold wire, silver wire or the like. The connection of the bonding wires BW1 to the terminals 71 to 75 may be performed using a common wire bonding technique (in this embodiment, a ball bonding method), and further the terminals 71 to 75 side becomes the starting point of the wire bonding and the IC 9 side becomes the end point of the wire bonding. However, the starting point of the wire bonding can be on the IC 9 side, and the end point can be on the terminals 71 to 75 side, and the ball bonding method can be replaced with a wedge bonding method.

As illustrated in FIG. 4, an alloy portion 70 formed by alloying (eutectic formation) the bonding wire BW1 of the terminal 71, a metal film 79 and the terminal 71 is formed at the connection portion between the bonding wire BW1 and the terminal 71. The thickness T1 of the terminal 71 is larger than the thickness T2 of the alloy portion 70. As an example, when the diameter of the bonding wire BW1 was 20 μm, the thickness of the metal film 79 was 0.2 μm, and the thickness of the terminal 71 was 25 μm, the alloy portion was 3 to 4 μm. In this way, by satisfying the relationship T1>T2, it is possible to stably increase the bonding strength between the terminal 71 and the bonding wire BW1. At the same time, it is possible to reduce deterioration of the joining state between the terminal 71 and the substrate 4. Therefore, it is possible to decrease the likelihood of the bonding wires BW1 coming off the terminal 71 and it is possible to form the electronic device having high reliability. Further, although not illustrated, the terminals 72 to 75 have the same structure as the terminal 71. Moreover, in the case of T1=T2, it is possible to provide a stable bonding strength between the terminal 71 and the bonding wire BW1. However, there is a risk of the alloy portion 70 reaching the joining portion between the substrate 4 and the terminal 71 and of the bonding strength between the substrate 4 and the terminal 71 deteriorating.

In this embodiment, the thickness of the terminals to 75 is roughly the same as the thickness of the functional element 6. This is, as described above, attributable to the patterning of the silicon substrate and the formation of the functional element 6 together with the terminals 71 to 75. However, the thickness of the terminals 71 to 75 may be larger than the thickness of the functional element 6 or may be smaller as long as the mechanical connection strength with the bonding wires BW1 is secured. Moreover, there is no particular limitation regarding the thickness T1 of the terminals 71 to 75; for example, when the diameter of the bonding wires BW1 is 20 μm, the thickness T1 is preferably equal to or greater than 5 μm and equal to or less than 25 μm. Consequently, it is possible to give the terminals 71 to 75 an appropriate thickness.

Moreover, in this embodiment, the metal film 79 is deposited on the surfaces of the terminals 71 to 75. The metal film 79 has a function of decreasing oxidation of the surfaces of the terminals 71 to 75 (that is, functions as an antioxidant film). If the surfaces of the terminals 71 to 75 become oxidized (that is, if a silicon oxide film forms), depending on the conditions of the wire bonding or the like, it is considered that the alloying of the terminals 71 to 75 and the bonding wires BW1 will be disrupted and that the connection strength between the terminals 71 to 75 and the bonding wires BW1 cannot be sufficiently increased. Therefore, by providing the terminals 71 to 75 with the metal film 79, and by preventing the oxidation of the terminals 71 to 75, it is possible to suppress a decrease in the connection strength between the terminals 71 to 75 and the bonding wires BW1.

Further, there is no particular limitation regarding the thickness of the metal film 79; however, the thickness is preferably equal to or greater than 0.1 μm and equal to or less than 0.5 μm. As a result, it is possible to make the metal film 79 thinner while ensuring a sufficient function of an antioxidant film. Therefore, it is possible for the metal film 79 to decrease the disruption of the alloying of the terminals 71 to 75 and the bonding wires BW1.

IC

The IC 9, as illustrated in FIG. 1, is fixed to the upper surface (on the lid 5) of the gyrosensor element 3. The IC 9 includes, for example, a drive circuit that drives the gyrosensor element 3, a detection circuit that detects the angular velocity ωy on the basis of an output signal output from the gyrosensor element 3, and an output circuit that converts a signal from the detection circuit into a certain signal and outputs the certain signal. The IC 9 such as that described above is electrically connected to the terminals 71 to 75 of the gyrosensor element 3 through the bonding wires BW1 and is electrically connected to the terminals 21 of the substrate 2 through the bonding wires BW2.

Mold Material

As illustrated in FIG. 1, the gyrosensor element 3 and the IC 9 are molded in the mold material M. Consequently, it is possible to protect the gyrosensor element 3, the IC 9 and the like from moisture, dust, mechanical shock and the like. There is no particular limitation regarding the mold material M; for example, a thermosetting type epoxy resin may be used; for example, it is possible to perform molding by using a transfer mold method.

Method of Manufacturing Electronic Device

The method of manufacturing the electronic device 1 includes a manufacturing process of manufacturing the gyrosensor element 3, a gyrosensor element arrangement process of arranging the gyrosensor element 3 on the substrate 2, an IC arrangement process of arranging the IC 9 on the gyrosensor element 3, an electrical connection process of electrically connecting the gyrosensor element 3 and the IC 9 to each other as well as electrically connecting the IC 9 and the substrate 2 to each other, and a sealing process of sealing the gyrosensor element 3 and the IC 9.

Moreover, the manufacturing process of manufacturing the gyrosensor element 3 includes a silicon substrate joining process of joining a silicon substrate 600 to the substrate 4 to each other, a patterning process of forming the functional element 6 and the terminals 7 from the silicon substrate 600 by patterning the silicon substrate 600, and a lid joining process of joining the lid 5 to the substrate 4 to each other. Hereinafter, each of these processes will be described in order.

Silicon Substrate Joining Process

Firstly, the substrate 4 (first substrate) on which the wires 81 to 85 are arranged is prepared. The substrate 4 having such a structure, for example, can be obtained by preparing a glass plate, by forming the recessed portion 41, the post 42 and the groove portions 43 to 47 by wet etching, and by arranging the wires 81 to 85 and the fixed detection electrodes 89.

Figure 5:
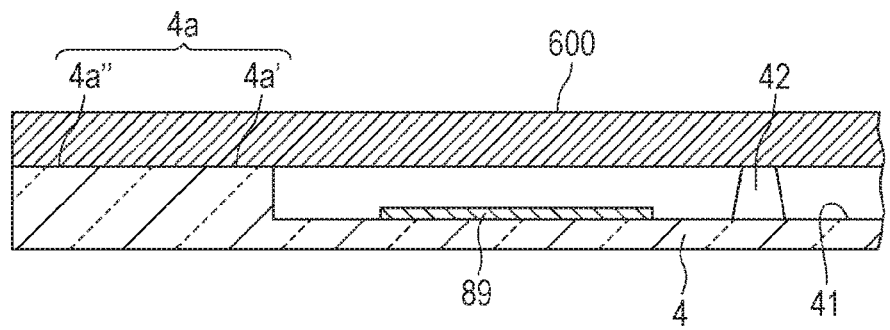
FIG. 5 is a cross-sectional view for explaining a method of manufacturing the electronic device illustrated in FIG. 1.
Figure 6:
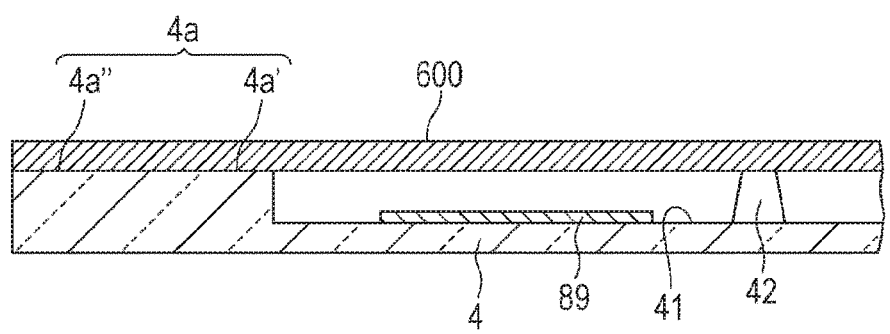
FIG. 6 is a cross-sectional view for explaining the method of manufacturing the electronic device illustrated in FIG. 1.

After the electrically conductive bumps B11 to B52 have been arranged on the substrate 4, the silicon substrate 600 (second substrate) is joined to the upper surface 4a (the functional element arrangement surface 4a' and the terminal arrangement surface 4a") of the substrate 4 as illustrated in FIG. 5. There is no particular limitation regarding the method of joining the substrate 4 and the silicon substrate 600; for example, anodic joining may be used. Next, as illustrated in FIG. 6, the silicon substrate 600 is subjected to sheet metal thinning up to a desired thickness by chemical mechanical polishing (CMP) or the like. Further, if the thicknesses of the functional element 6 and the terminals 7 are the same, it is preferable to perform sheet metal thinning uniformly to a predetermined thickness, and if the thicknesses of the functional element 6 and the terminals 7 are different, it is preferable to change the thicknesses of a portion on the functional element arrangement surface 4a' and of a portion on the terminal arrangement surface 4a" while performing sheet metal thinning.

Patterning Process

Figure 7:
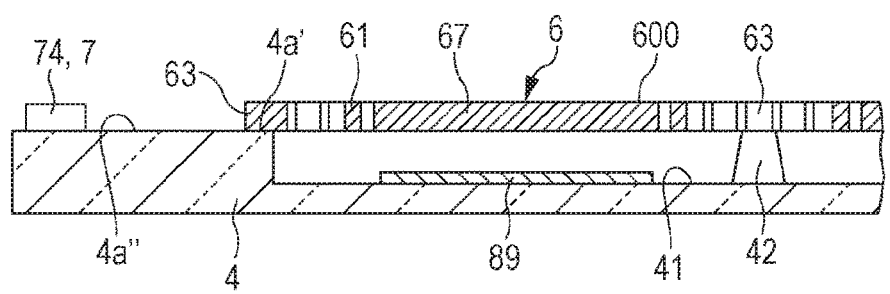
FIG. 7 is a cross-sectional view for explaining the method of manufacturing the electronic device illustrated in FIG. 1.

Next, the silicon substrate 600 is doped with impurities such as phosphorous, boron, or the like and is thus given electrical conductivity. Next, patterning is performed by using a photolithography method and an etching method and, as illustrated in FIG. 7, the functional element 6 and the terminals 7 are formed from the silicon substrate 600. In this way, according to the manufacturing method, because it is possible to form the functional element 6 and the terminals 7 from the silicon substrate 600 at the same time, the method of manufacturing the electronic device 1 becomes easier.

Lid Joining Process

Figure 8:
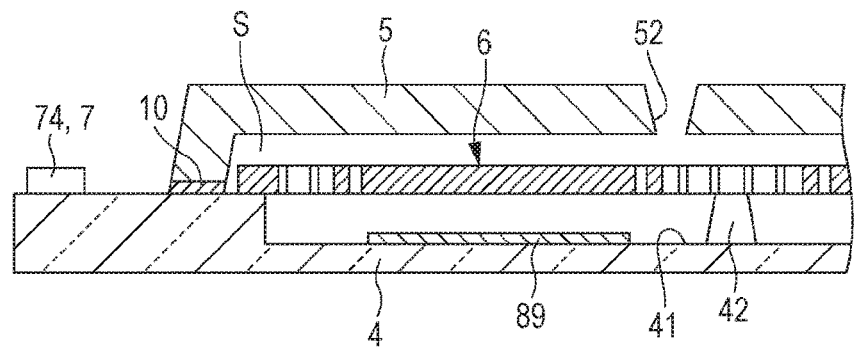
FIG. 8 is a cross-sectional view for explaining the method of manufacturing the electronic device illustrated in FIG. 1.
Figure 9:
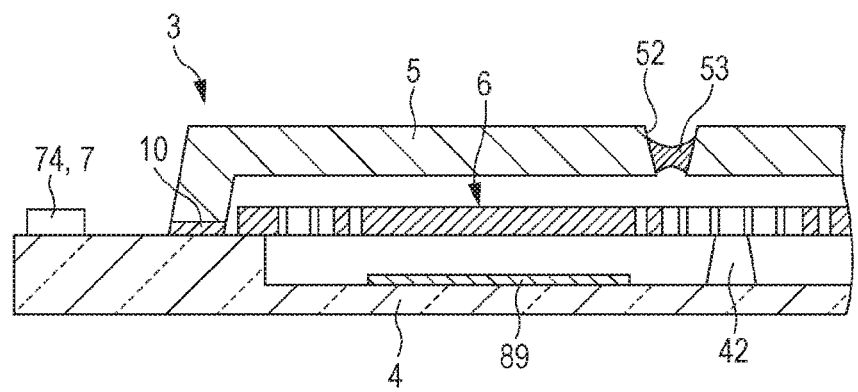
FIG. 9 is a cross-sectional view for explaining the method of manufacturing the electronic device illustrated in FIG. 1.

Next, the lid 5 is prepared and, as illustrated in FIG. 8, the lid 5 and the substrate 4 are joined through the joining member 10. Further, by arranging the joining member on the lower surface of the lid 5 in advance, it is possible to smoothly perform joining of the lid 5 and the substrate 4. Next, after attaining a low-pressure state in the internal space S through the sealing hole 52 of the lid 5, as illustrated in FIG. 9, the sealing hole 52 is sealed with the sealant 53. Sealing by the sealant 53 is performed, for example, by arranging the sealant 53 having a ball shape in the sealing hole 52, and by melting the sealant 53 by using laser irradiation or the like. The gyrosensor element 3 is obtained in the above-described manner.

Gyrosensor Element Arrangement Process

Figure 10:
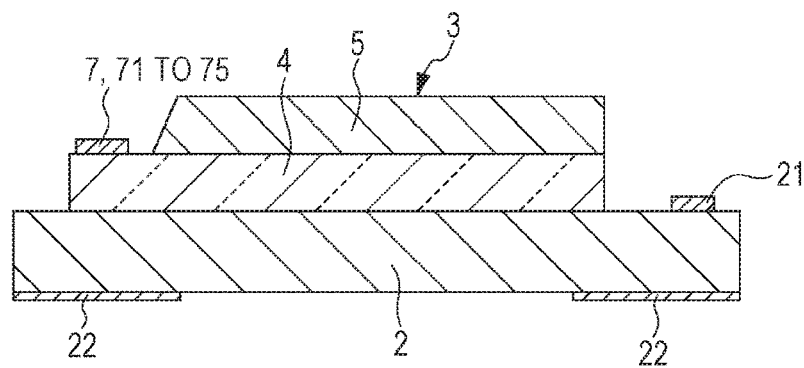
FIG. 10 is a cross-sectional view for explaining the method of manufacturing the electronic device illustrated in FIG. 1.

Next, the substrate 2 is prepared and, as illustrated in FIG. 10, the gyrosensor element 3 is fixed to the upper surface of the substrate 2.

IC Arrangement Process

Figure 11:
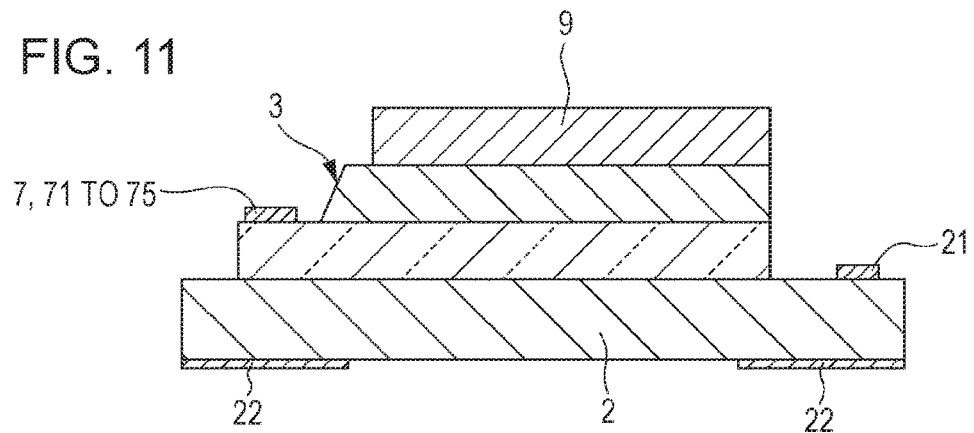
FIG. 11 is a cross-sectional view for explaining the method of manufacturing the electronic device illustrated in FIG. 1.

The IC 9 is prepared and, as illustrated in FIG. 11, the IC 9 is fixed to the upper surface of the gyrosensor element 3.

Electrical Connection Process

Figure 12:
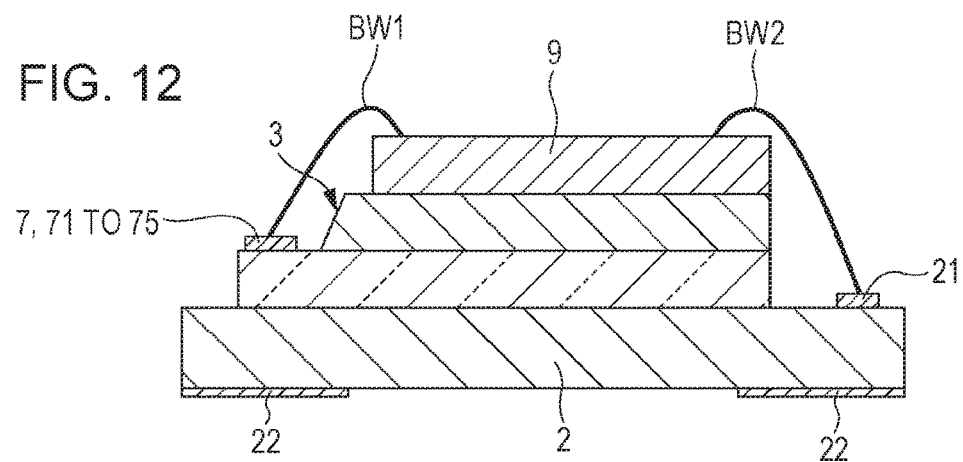
FIG. 12 is a cross-sectional view for explaining the method of manufacturing the electronic device illustrated in FIG. 1.

Next, as illustrated in FIG. 12, the gyrosensor element 3 (the terminals 71 to 75) and the IC 9 are electrically connected to each other by using the bonding wires BW1 and the IC 9 and the substrate 2 are electrically connected to each other by using the bonding wire BW2.

Sealing Process

Figure 13:
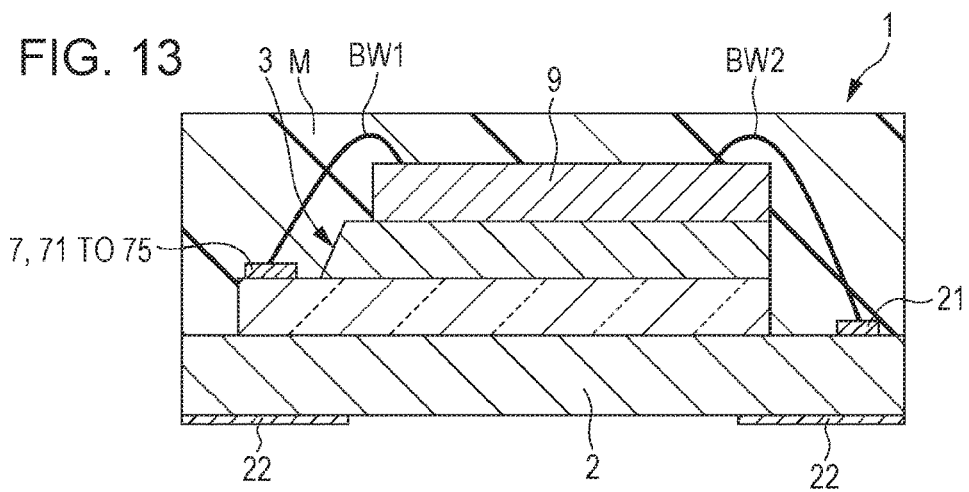
FIG. 13 is a cross-sectional view for explaining the method of manufacturing the electronic device illustrated in FIG. 1.

Next, as illustrated in FIG. 13, the gyrosensor element 3 and the IC 9 are sealed by the mold material M. The electronic device 1 is obtained in the above-described manner.

Second Embodiment

Figure 14:
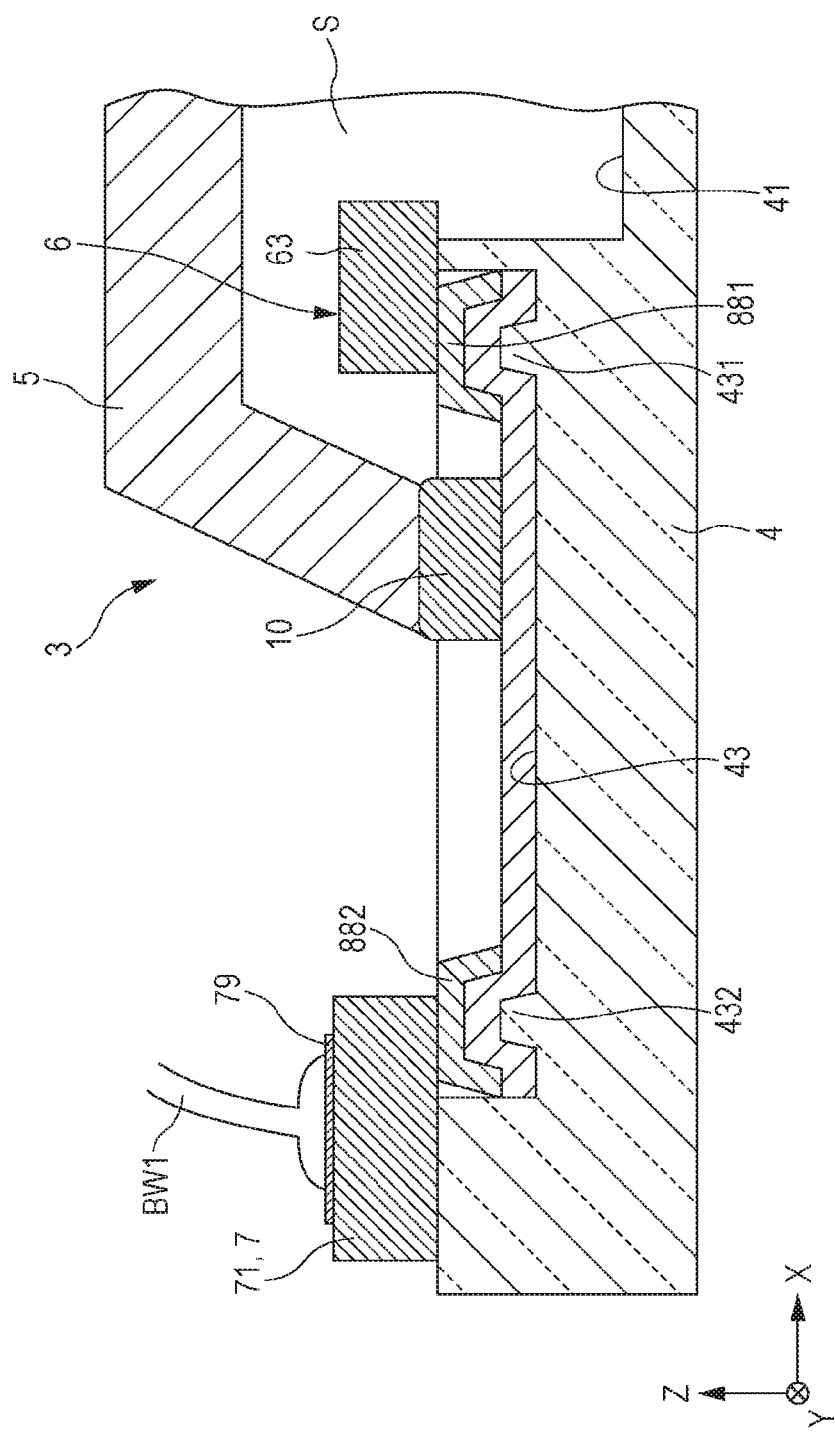
FIG. 14 is a cross-sectional view of an electronic device according to a second embodiment of the invention.

FIG. 14 is a cross-sectional view of an electronic device according to a second embodiment of the invention.

Hereinafter, the electronic device of the second embodiment will be described with a focus on the differences from the embodiment described above and explanation of similar matters will be omitted.

The electronic device of the second embodiment is mainly the same as the electronic device of the first embodiment except that the method of connecting the terminals and the functional element of the gyrosensor element and the wires is different. Further, in FIG. 14, in a structure that is the same as the above-described embodiment, the same reference signs are used.

In this embodiment, as illustrated in FIG. 14, the substrate 4 includes projecting portions 431 and 432 that project from the groove portion 43. The projecting portions 431 and 432 are formed integrally with the substrate 4. Then, the wire 81 is arranged so as to go over the projecting portions 431 and 432. Furthermore, an electrically conducting portion 881 (first connecting member) is provided on the wire 81 on the projecting portion 431 and an electrically conducting portion 882 (second connecting member) is provided on the wire 81 on the projecting portion 432. Then, the wire 81 and the fixed portions 63 are electrically connected to each other through the electrically conducting portion 881 and the wire 81 and the terminal 71 are electrically connected to each other through the electrically conducting portion 882. According to such a structure, the strengths of the electrical connection portion between the wire 81 and the terminal 71 and the electrical connection portion between the wire 81 and the fixed portions 63 may, for example, be made higher than in the first embodiment described above. Further, in the above, although description is made for case of the groove portion 43, the structure is the same for the groove portions 44 to 47.

It is possible for the second embodiment having such a structure to exhibit the same effect as the first embodiment.

Electronic Apparatus

Next, an electronic apparatus having the electronic device of the invention will be described.

Figure 15:
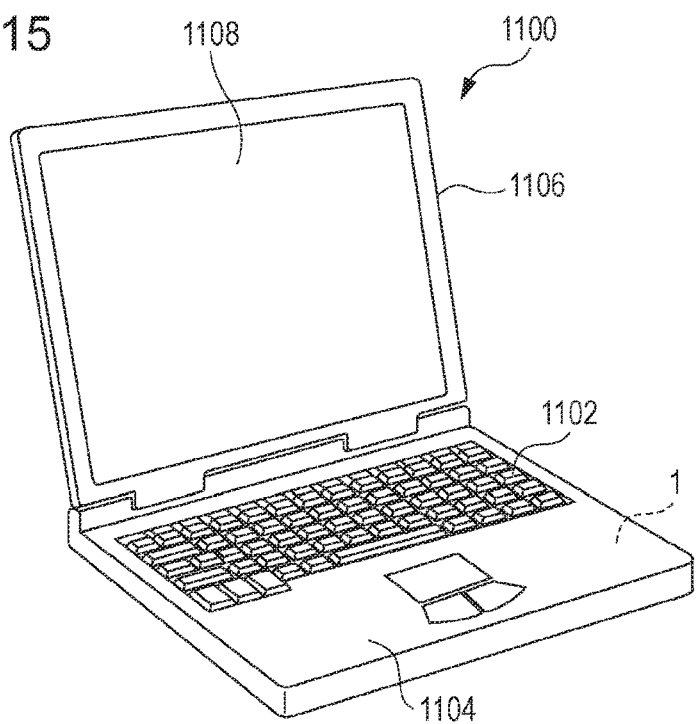
FIG. 15 is a perspective view of a structure of a mobile-type (or note-type) personal computer to which the electronic apparatus of the invention has been applied.

FIG. 15 is a perspective view of a structure of a mobile-type (or note-type) personal computer to which an electronic apparatus of the invention has been applied.

In this diagram, a personal computer 1100 is formed of a body portion 1104 having a keyboard 1102, and a display unit 1106 having a display portion 1108, and the display unit 1106 is rotatably supported by a hinge structure with respect to the body portion 1104. In the personal computer 1100 such as that described above, the electronic device 1 is built in.

Figure 16:
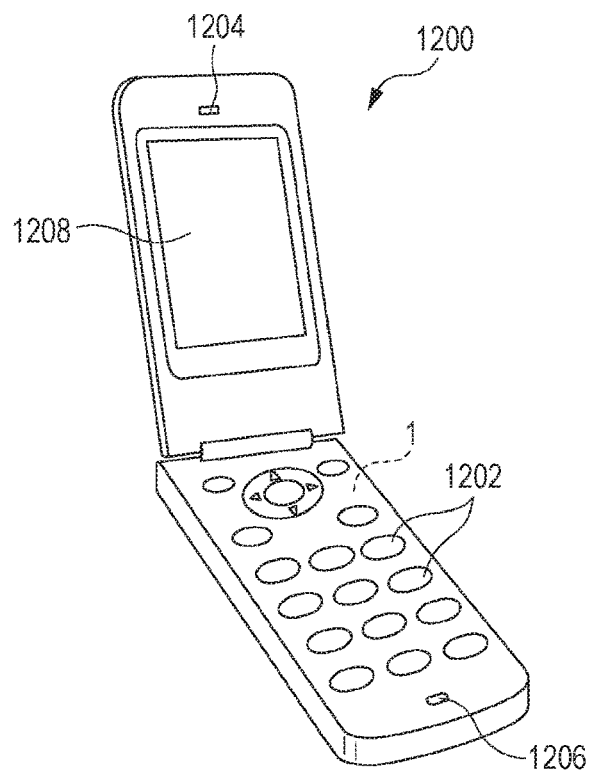
FIG. 16 is a perspective view of a structure of a portable phone (also including PHS) to which the electronic apparatus of the invention has been applied.

FIG. 16 is a perspective view of a structure of a portable phone (also including PHS) to which an electronic apparatus of the invention has been applied.

In this diagram, a portable telephone 1200 has an antenna (not illustrated), a plurality of operation buttons 1202, an ear piece 1204, and a mouth piece 1206, and a display portion 1208 is arranged between the operation buttons 1202 and the ear piece 1204. In the portable telephone 1200 having such a structure, the electronic device 1 is built in.

Figure 17:
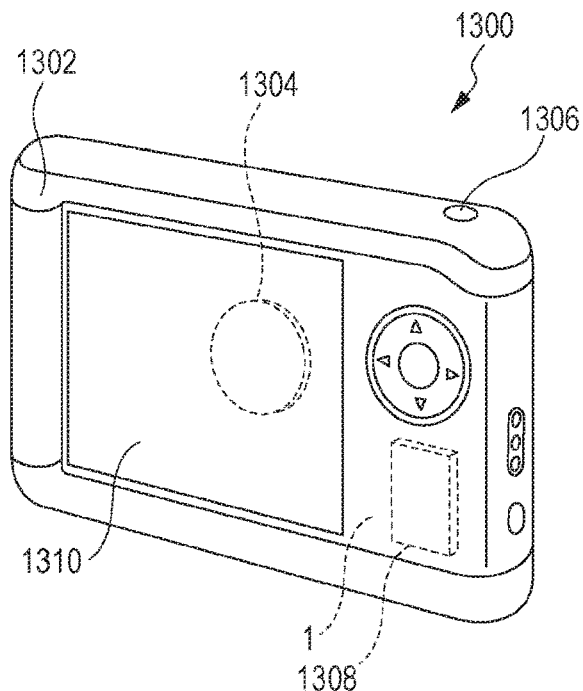
FIG. 17 is a perspective view of a structure of a digital still camera to which the electronic apparatus of the invention has been applied.

FIG. 17 is a perspective view of a structure of a digital still camera to which an electronic apparatus of the invention has been applied.

A display portion 1310 is provided on a rear surface of a case 1302 of a digital still camera 1300, and is configured to perform display on the basis of an imaging signal obtained by a CCD, and the display portion 1310 functions as a finder that displays a subject as an electronic image. Moreover, a light receiving unit 1304 that includes an optical lens (imaging optical system), a CCD and the like is provided on the front surface side (back surface in the figure) of the case 1302. Then, upon a photographer confirming a subject image displayed on the display portion 1310 and pushing a shutter button 1306, at that point in time, an imaging signal of the CCD is transmitted to and stored in a memory 1308. In the digital still camera 1300 having such as structure, for example, the electronic device 1 used as an image stabilizing system is built in.

Such an electronic apparatus has superior reliability because it has the electronic device 1.

Further, the electronic apparatus of the invention can be applied to, in addition to the personal computer of FIG. 15, the portable telephone of FIG. 16 and the digital still camera of FIG. 17, for example, a smartphone, a tablet terminal, a clock (including smart watches), an ink-jet-type discharge device (for example, an inkjet printer), a laptop personal computer, a TV, a video camera, a video tape recorder, a car navigation device, a pager, an electronic notebook (including a communication function), an electronic dictionary, an electronic calculator, an electronic game apparatus, a word processor, a work station, a videophone, a television monitor for crime prevention, electronic binoculars, a POS terminal, medical apparatus (for example, electronic thermometers, sphygmomanometers, blood sugar meters, electrocardiogram measurement devices, somascopes, and electronic endoscopes), a fishfinder, various measuring apparatus, instruments (for example, the instruments of a car, a plane, or a ship), a flight simulator and the like.

Mobile Body

Next, a description of the mobile body of the invention will be given.

Figure 18:
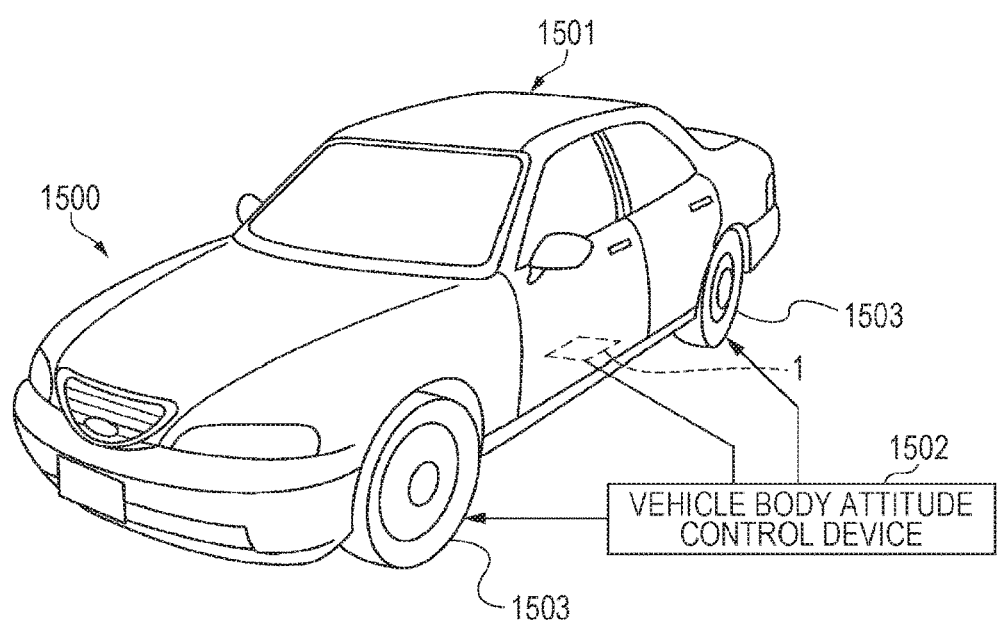
FIG. 18 is a perspective view of a car to which a mobile body of the invention has been applied.

FIG. 18 is a perspective view of a car to which a mobile body of the invention has been applied.

A car 1500 has the electronic device 1 built-in and, for example, it is possible to detect the attitude of a car body 1501 by using the electronic device 1. A detection signal of the electronic device 1 is supplied to a car body attitude control device 1502, and the car body attitude control device 1502 can detect the attitude of a car body 1501 on the basis of the signal, and can control the hardness of the suspension and the brakes of individual wheels 1503 in accordance with the result of the detection.

In addition, such attitude control can be used by bipedal robots, radio control helicopters (including drones) and the like. The electronic device 1 is incorporated as above in realization of the attitude control of various mobile bodies.

Even though an electronic device, a method of manufacturing the electronic device, an electronic apparatus, and a mobile body of the invention are described above on the basis of the embodiment shown in accompanying drawings, the invention is not limited to the above-described content, and the configuration of each part may be replaced with a part having any configuration with a similar function. Moreover, any other components may be added to the invention.

Moreover, in the above-described embodiment, even though the detection flap plate is described as a structure that rotates about a rotation axis, the detection flap plate may be displaced in any way as long as it may be displaced in the Z-axis direction. For example, the detection flap plates may be displaced in a see-saw oscillation about the rotation axis or may be displaced in the Z axis direction while maintaining attitude. That is, they may be a see-saw-type physical quantity sensor or a parallel-plate-type physical quantity sensor.

Moreover, the functional element is not limited to an element that detects angular velocity; for example, it may be an element that detects acceleration, an element that detects atmospheric pressure or the like. Moreover, the functional element is not limited to an element that detects a physical quantity such as the above-mentioned element that detects angular velocity, element that detects acceleration and element that detects atmospheric pressure; for example, it may be a vibrator used in oscillators.

The entire disclosure of Japanese Patent Application No. 2015-216933, filed Nov. 4, 2015 is expressly incorporated by reference herein.

What is claimed is:

1. An electronic device comprising:
   a substrate having a recess;
   a functional element that is arranged on the substrate;
   a terminal that is arranged on the substrate, the terminal overlapping and extending over an edge of the recess and being electrically connected to the functional element, a portion of the terminal that overlaps and extends over the edge of the recess is supported by a first electrically conductive bump that is spaced apart from the edge of the recess and spaced apart from a terminal edge of the terminal that extends over the edge of the recess; and a linear wire that is connected to the terminal at a connection portion where a material of the terminal is intermixed with a material of the linear wire such that an alloy mixture of the material of the terminal and the material of the linear wire is defined, and a thickness of the terminal is larger than a thickness of the alloy mixture.

2. The electronic device according to claim 1, wherein the material of the terminal is the same as a material of the functional element.

3. The electronic device according to claim 2, wherein the functional element and the terminal contain silicon.

4. The electronic device according to claim 3, wherein one of a pair of main surfaces of the substrate has a functional element arrangement surface on which the functional element is arranged and a terminal arrangement surface on which the terminal is arranged.

5. The electronic device according to claim 3, wherein a connection wire is arranged in the recess, the connection wire being electrically connected to the functional element through a second electrically conductive bump and being electrically connected to the terminal through the first electrically conductive bump.

6. The electronic device according to claim 3, wherein a metal film is arranged on a surface of the terminal.

7. The electronic device according to claim 2, wherein one of a pair of main surfaces of the substrate has a functional element arrangement surface on which the functional element is arranged and a terminal arrangement surface on which the terminal is arranged.

8. The electronic device according to claim 2, wherein a connection wire is arranged in the recess, the connection wire being electrically connected to the functional element through a second electrically conductive bump and being electrically connected to the terminal through the first electrically conductive bump.

9. The electronic device according to claim 2, wherein a metal film is arranged on a surface of the terminal.

10. The electronic device according to claim 1, wherein one of a pair of main surfaces of the substrate has a functional element arrangement surface on which the functional element is arranged and a terminal arrangement surface on which the terminal is arranged.

11. The electronic device according to claim 10, wherein a connection wire is arranged in the recess, the connection wire being electrically connected to the functional element through a second electrically conductive bump and being electrically connected to the terminal through the first electrically conductive bump.

12. The electronic device according to claim 10, wherein a metal film is arranged on a surface of the terminal.

13. The electronic device according to claim 1, wherein a connection wire is arranged in the recess, the connection wire being electrically connected to the functional element through a second electrically conductive bump and being electrically connected to the terminal through the first electrically conductive bump.

14. The electronic device according to claim 13, wherein a metal film is arranged on a surface of the terminal.

15. The electronic device according to claim 1, wherein a metal film is arranged on a surface of the terminal.

16. The electronic device according to claim 1, wherein the electronic device includes a lid that is joined to the substrate so as to house the functional element between the lid and the substrate, and the terminal is located on an outer side of the lid.

17. The electronic device according to claim 16, wherein the substrate and the lid are joined to each other through a glass material.

18. An electronic apparatus comprising:
the electronic device according to claim 1.

19. A mobile body comprising:
the electronic device according to claim 1.

* * * * *